(12) United States Patent
Wojick (10) Patent No.: US 6,381,469 B1
(45) Date of Patent: Apr. 30, 2002

(54) FREQUENCY EQUALIZER, AND ASSOCIATED METHOD, FOR A RADIO TELEPHONE

(75) Inventor: Scott Wojick, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/165,611

(22) Filed: Oct. 2, 1998

(51) Int. Cl.[7] .................................. H04Q 7/20
(52) U.S. Cl. ..................... 455/550; 455/344; 455/66
(58) Field of Search ................. 455/187.1, 188.1, 455/179.1, 556, 200.1, 557, 339, 90, 340, 343, 344, 345, 351, 550, 501, 63, 65, 570, 66; 375/222, 232, 231, 233, 230, 229, 348, 354, 350, 346, 333, 334

(56) References Cited

U.S. PATENT DOCUMENTS

| 5,203,027 A | * | 4/1993 | Nounin et al. ............... 455/134 |
| 5,214,671 A | * | 5/1993 | Nakai ........................... 375/232 |
| 5,231,648 A | * | 7/1993 | Driedger et al. ............ 375/231 |
| 5,233,634 A | * | 8/1993 | Vaisanen ..................... 375/320 |
| 5,285,480 A | * | 2/1994 | Chennakeshu et al. ...... 375/348 |
| 5,291,519 A | * | 3/1994 | Tsurumaru .................. 375/230 |
| 5,297,169 A | * | 3/1994 | Backstrom et al. ......... 375/231 |
| 5,394,475 A | | 2/1995 | Ribic ......................... 381/68.2 |
| 5,499,268 A | * | 3/1996 | Takahashi ................... 375/231 |
| 5,537,673 A | * | 7/1996 | Nagashima et al. ......... 455/346 |
| 5,537,680 A | * | 7/1996 | Bruno ........................ 455/67.1 |
| 5,563,888 A | * | 10/1996 | Parr et al. ................... 370/516 |
| 5,563,911 A | * | 10/1996 | Uesugi et al. .............. 375/232 |
| 5,745,583 A | * | 4/1998 | Koizumi et al. .............. 381/86 |
| 5,768,397 A | | 6/1998 | Fazio ........................... 381/68 |
| RE36,017 E | * | 12/1998 | Uddenfeldt .................. 375/230 |
| 6,011,853 A | * | 1/2000 | Koski et al. ................... 381/56 |
| 6,028,901 A | * | 2/2000 | Huynh et al. ............... 375/350 |
| 6,085,078 A | * | 7/2000 | Stamegna ................... 455/345 |

FOREIGN PATENT DOCUMENTS

| KR | | 018185 A | * | 3/2001 | ............ H04B/1/38 |
| WO | | WO 99/14986 | | 3/1999 | |

* cited by examiner

*Primary Examiner*—Dwayne Bost
*Assistant Examiner*—Jean A Gelin
(74) *Attorney, Agent, or Firm*—Steven Shaw (57) ABSTRACT

A frequency equalizer, and an associated method, for radio telephone to cause the tonal characteristics of audio signals generated by the radio telephone to exhibit a desired sound. Selectable groups of preset amplification levels are stored at the radio telephone which define equalization curves. Selection by a user of the radio telephone of a selected equalization curve causes the frequency equalizer to selectively amplify portions of a signal representative of a receive signal provided to the frequency equalizer. Once amplified in this manner, the amplified signal is provided to an acoustic transducer whereat an audio signal is formed.

19 Claims, 5 Drawing Sheets

FREQUENCY EQUALIZER, AND ASSOCIATED METHOD, FOR A RADIO TELEPHONE

The present invention relates generally to a radio telephone, such as a radio telephone operable in a cellular communication system. More particularly, the present invention relates to a frequency equalizer, and an associated method, for the receiver portion of the radio telephone. Selected portions of a signal representative of a receive signal received by the receiver portion of the radio telephone are amplified at selected amplification levels. The resultant acoustic signal formed by the radio telephone is caused to be of improved tonal characteristics.

BACKGROUND OF THE INVENTION

A communication system is operable to communicate information between a transmitting station and a receiving station by way of a communication channel. A radio communication system is a communication system in which the communication channel by which information is communicated between the transmitting and receiving stations is formed upon a portion of the electromagnetic spectrum. A cellular communication system is exemplary of a multi-user, radio communication system.

Two-way, telephonic communication, analogous to the telephonic communication conventionally permitted pursuant to a wire line telephonic system, is possible by way of a cellular communication system. That is to say, a radio telephone is used to originate a call, or at which to terminate a call, in a manner analogous to operation of a conventional, wire line telephone.

To originate a call, a user of the radio telephone enters, by way of a telephonic keypad, the digits forming a telephone number of a terminating station. Once entered, the telephone number is transmitted by way of a communication channel to network infrastructure of the cellular communication system. The network infrastructure is, in turn, connected to a public-switched telephonic network. The call request originated at the radio telephone is routed therethrough to the terminating station. Subsequent to call set-up procedures, a call connection is thereafter effectuated, thereby to permit telephonic communication between the originating and terminating stations.

A call originated at a radio telephone is analogously also possible with another radio telephone. That is to say, the telephone number associated with the terminating station formed of a terminating radio telephone is entered by the user of the originating radio telephone. And, the call request is transmitted over the communication channel, to the network infrastructure, then the public-switched telephonic network, and thereafter through additional network infrastructure, over a communication channel, to be terminated at the terminating radio telephone.

A call is terminated at a terminating radio telephone by entering the telephone number associated with the terminating radio telephone at an originating station. A call request is routed through the public-switched telephonic network, network infrastructure of a cellular communication system, and upon a communication channel, thereafter to be received at the terminating radio telephone. Subsequent to call set-up procedures, two-way, telephonic communication is permitted.

Because uplink signals originated at, and downlink signals terminated at, the radio telephone are transmitted upon a radio communication channel, such signals must be of characteristics to permit their transmission upon the respective radio channels. Viz., uplink signals transmitted by the radio telephone must be converted into a form to permit their transmission upon a radio communication channel. And, downlink signals received at the radio telephone must be converted into a form to permit their transmission upon a radio communication channel.

A radio telephone includes a receiver portion operable to receive a downlink signal transmitted thereto. The receiver portion converts the downlink signal into electrical form down-converts the downlink signal from a radio frequency to a baseband-level, and demodulates the baseband-level signal. Once demodulated, the signal is transduced by a speaker, or other acoustic transducer.

The bandwidth of the acoustic signal generated by the acoustic transducer of a conventional radio telephone is sometimes on the order of about three kilohertz. The audio signals generated by the audio transducer of a conventional radio telephone are typically of substantially fixed characteristics. While the amplitude of an audio signal generated by a radio telephone sometimes can be altered, such as by way of a volume control, the tonal characteristics of the audio signal generally otherwise are unchangeable.

Different users of a radio telephone might have different aural capabilities. That is to say, different users of the radio telephone have differing capacities of detecting component portions of the audio signal at various bandwidth-frequency regions of the audio signal. Alteration of the tonal characteristics to selectively amplify selected bandwidth-frequency regions of the audio signal would facilitate user detection of the audio signal.

Also, selective alteration of the tonal characteristics of various bandwidth-frequency regions of the audio signal would also make the audio signal appear to the user to sound better. For instance, some users prefer to hear audio signals containing pronounced bass components; some other users prefer to hear audio signals containing pronounced treble components.

A manner by which to selectively alter the tonal characteristics of an audio signal generated by a radio telephone would therefore be advantageous.

It is in light of this background information related to audio signals generated by a radio telephone that the significant improvements of the present invention have evolved.

SUMMARY OF THE INVENTION

The present invention, accordingly, advantageously provides an audio frequency equalizer, and an associated method, for a radio telephone. Improved tonal characteristics of an audio signal representative of a receive signal received at the radio telephone is possible by amplifying selected portions of a signal representative of the receive signal at selected amplification levels.

In one implementation, a user of the radio telephone is able to select from amongst several groups of preset amplification levels by which to amplify a signal, prior to transducing the signal into acoustic form. The amplification levels of each group define equalization curves by which to amplify a signal received by the radio telephone, prior to transducing the signal into audio form. The tonal characteristics of the audio signal are thereby selectable by the radio telephone user, and an equalization curve appearing "to sound the best" can be selected by the user. Appropriate selection of the amplification levels forming a group which defines an equalization curve, which causes, e.g., high-treble, or high-bass, tonal characteristics to be exhibited by the resultant audio signal.

Values of the preset amplification levels of the groups of amplification levels are stored in a memory device, such as an EEPROM (electrically erasable programmable read only memory). The values of the amplification levels of a selected group defining a selected equalization curve are retrieved and applied to control operation of the frequency equalizer, thereby to form a signal, when transduced by an acoustic transducer of desired tonal characteristics.

Selection is made, for example, by way of a user interface of the radio telephone utilizing a menu-driven display caused to be displayed upon a user display of the radio telephone. The user of the radio telephone selects the tonal characteristics of the audio signal by entering appropriate commands on an input actuation keypad of the radio telephone. When formed, preset amplification levels are stored in a memory element, the menu-driven display permits a user selection of a selected group of preset amplification levels to cause the frequency equalizer to form the equalization curve associated therewith. In another implementation, the user selects the amplification levels by way of the user interface at which different bandwidth-frequency regions are to be amplified.

Because the tonal characteristics of the acoustic signal generated by the radio telephone is user-selectable, the radio telephone can be personalized in a manner believed by the user to form acoustic signals of tonal characteristics most desired by the user.

In these and other aspects, therefore, a frequency equalizer, and an associated method, is provided for a radio telephone having a radio receiver. The frequency equalizer is coupled to receive an electrical signal representative of a receive signal received by the radio receiver. The electrical signal is defined by a signal bandwidth wherein the signal bandwidth is divisible into bandwidth frequency regions. The frequency equalizer selectively amplifies the electrical signal at selectable amplification levels. Each bandwidth frequency region into which the signal is divided is amplified at a separately-selectable amplification level.

A more complete appreciation of the present and to the scope thereof can be obtained from the accompanying drawings which are briefly summarized below, the following detailed description of the presently-preferred embodiments of the invention, and the appended claims.

DETAILED DESCRIPTION

Figure 1A:
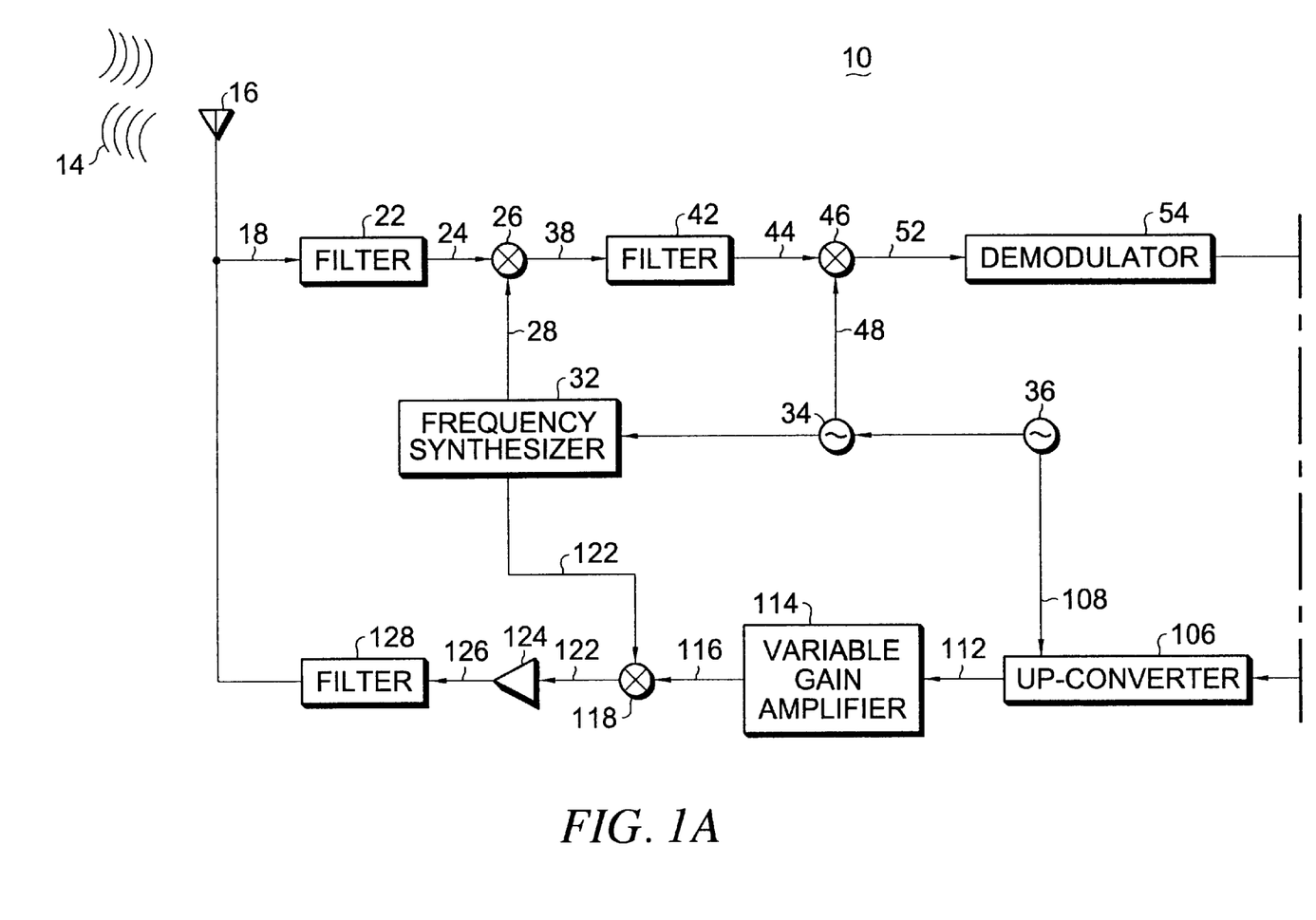
FIG. 1 illustrates a functional block diagram of a radio telephone in which an embodiment of the present invention is operable.
Figure 1B:
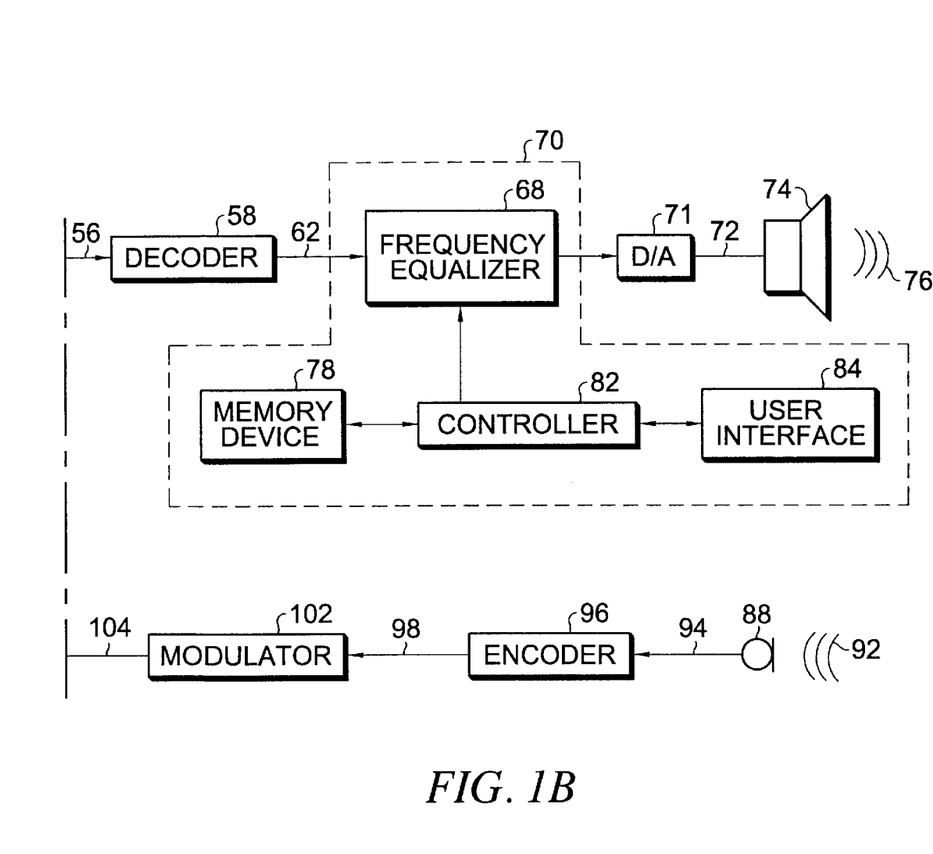

Referring first to FIG. 1, a radio telephone, shown generally at 10, is operable to transceive radio-frequency communication signals. During operation, the radio telephone is operable to receive downlink signals 12 transmitted to the radio telephone, and to generated and transmit uplink signals 14 for transmission from the radio telephone. In an exemplary implementation in which the radio telephone 10 is operable in a cellular communication system, the radio telephone is permitting of full duplex operation. When constructed to be operable in a cellular communication system, the radio telephone 10 permits a user thereof to communicate telephonically with a remote station. In other embodiments, the radio telephone 10 is constructed to be operable in other types of radio communication systems.

The radio telephone 10 includes an antenna transducer 16 operable to detect a downlink signal 12 and to transduce into electrical form the detected downlink signal. An electrical signal representative of the downlink signal is provided by way of a line 18 to a filter 22, here forming a portion of a duplex filter. A filtered signal generated by the filter 22 on the line 24 is provided to an input terminal of a first down-mixer 26. A first down-mixing signal generated on the line 28 by a frequency synthesizer 32 is provided to a second input of the down-mixer 26. The frequency synthesizer 32 receives an oscillating signal generated by an oscillator 34 which, in turn, is maintained in a frequency relationship with a local oscillator 36.

The down-mixer 26 is operable to down-mix in frequency the signal provided thereto on the line 24 and to generated a first down-mixed signal on the line 38. The line 38 is coupled to a filter 42 which filters the first down-mixed signal and generates a filtered signal on the line 42 which is coupled to an input terminal of a second down-mixer 46. A second down-mixing signal generated on the line 48 by the oscillator 34 is provided to a second input terminal of the down-mixer 46. A second down-mixed signal is generated on the line 52 by the down-mixer 46. The line 52 is coupled to a demodulator 54. The demodulator 54 demodulates the signal provided thereto and generates a demodulated signal on the line 56.

The line 56 is coupled to a decoder 58 which decodes the demodulated signal provided thereto and generates a decoded signal on the line 62 which is provided to a frequency equalizer 68.

The equalizer 68 forms a portion of the apparatus 70 operable pursuant to an embodiment of the present invention to permit user selection of the manner by which portions of the signal provided to the equalizer 68 are amplified. Responsive to such selection, the frequency equalizer 68 selectively amplifies selected portions of the signal provided thereto and generates an amplified signal which is provided to a digital-to-analog converter 71. Analog signals formed by the converter 71 are coupled, by way of the line 72, to an acoustic transducer 74. The transducer converts the signals provided thereto into acoustic form to generate audio signals 76 of selected tonal characteristics. In another embodiment, the positions of the equalizer 68 and the converter 71 are reversed.

In an exemplary embodiment of the present invention, groups of preset values are stored in a memory device 78, here an EEPROM (electrically erasable programmable read only memory). The preset values are formed into groups, each preset value of the group identifying an amplification level at which to amplify a selected frequency-bandwidth region of a signal applied to the frequency equalizer 68.

The memory device 78 is coupled to a controller 82 which, in turn, is coupled to a user interface 84 formed of a display element, such as a liquid crystal display, and an input actuator, e.g., the actuation keys of an actuation keypad of the radio telephone. The controller 82 is operable, inter alia, to cause generation on the display element of the user interface display menus, to detect user inputs entered by way of the input actuator of the user interface, and to retrieve indications of the preset values stored at the memory device 78. The controller 82 is further coupled to the frequency equalizer 68 by way of the line 86 to control operation of the equalizer. That is to say, the retrieved indications of the values stored at the memory device 78 are provided to the equalizer 68 by way of the line 86 to control operation of the equalizer. When groups of preset values are stored at the memory device, each group defining an equalizer curve, user selection of a particular one of the equalizer curves causes the controller 82 to access the appropriate memory location thereof which contain the values of the preset amplification levels of the selected group. Indications of such values are provided by the controller to the equalizer 68 to control operation of the equalizer.

The radio telephone 10 is further shown to include a transmitter portion through which to generate the uplink signals 14. The transmitter portion of the radio telephone is here shown t include a microphone 88 which is operable to transduce acoustic signals 92 provided thereto into electrical form on the line 94. The line 94 is coupled to an encoder 96 which encodes the signal provided thereto. The encoder is coupled, by way of a line 98 to a modulator 102 which is operable to modulate the encoded signals and to generate a modulated signal on the line 104. The line 104 is coupled to an up-converter 106. The up-converter 106 is further coupled to receive an up-mixing signal generated on the line 108. The up-converter 106 generates a first up-converted signal on the line 112 which is coupled to a variable gain amplifier 114. The amplifier 114 is operable to amplify the signal provided thereto with a selected amount of gain and to generate a first amplified signal on the line 116 which is coupled to an input terminal of an up-mixer 118. The up-mixer 118 is further coupled to receive a second up-mixing signal generated on the line 122 and provided to a second input terminal of the up-mixer. The up-miser 118 generates a second up-mixed signal on the line 122 which is coupled to an input of a power amplifier 124. The power amplifier 124 is operable to amplify the level of the signal applied thereto and to generate an amplified signal on the line 126. The line 126 is coupled to a filter 128 of a duplexer filter which filters the signal applied thereto and provides the filtered signal formed threat to the antenna transducer 16 to be transduced into electromagnetic form, thereby to form the uplink signal 14.

Figure 2:
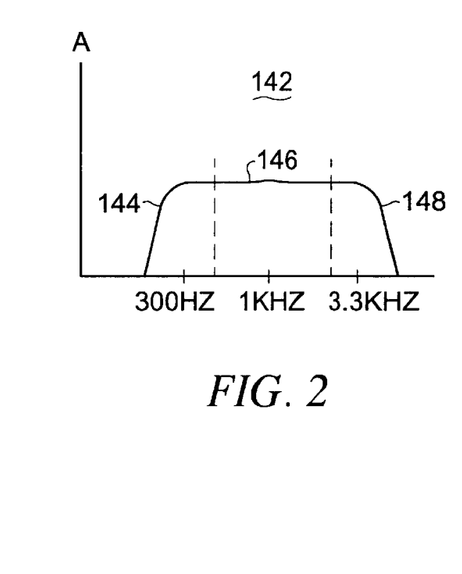
FIG. 2 illustrates a graphical representation of an electrical signal applied to the frequency equalizer which forms a portion of the radio telephone shown in FIG. 1.

FIG. 2 illustrates a frequency representation of an exemplary signal, shown generally at 142, which is provided to the frequency equalizer 68 (shown in FIG. 1) of an embodiment of the present invention. The signal is here shown to be of a bandwidth of approximately three kilohertz. And, the signal 142 is divisible into a selected number of frequency-bandwidth regions. Here, the signal is divided into three regions, a first region 144, a second region 146, and a third region 148. The first region 144 is a low-frequency region, the second region 146 is a mid-frequency region, and the third region 148 is a high-frequency region of the signal 142.

The frequency equalizer 68 (shown in FIG. 1) in the exemplary implementation, is operable to amplify the three bandwidth frequency regions 144, 146, and 148 at selected amplification levels responsive to the signals provided thereto by way of the line 86. As, in the exemplary embodiment, the controller 82 generates signals on the line 86 representative of the values of the preset amplification levels stored in the memory device 78 selected by the user by way of the user interface 84, the amplified signals generated by the equalizer 68 are formed responsive to user selection. Thereby, the resultant audio signals 76 generated by the transducer 74 are of tonal characteristics selected by the user of the radio telephone.

Figure 3:
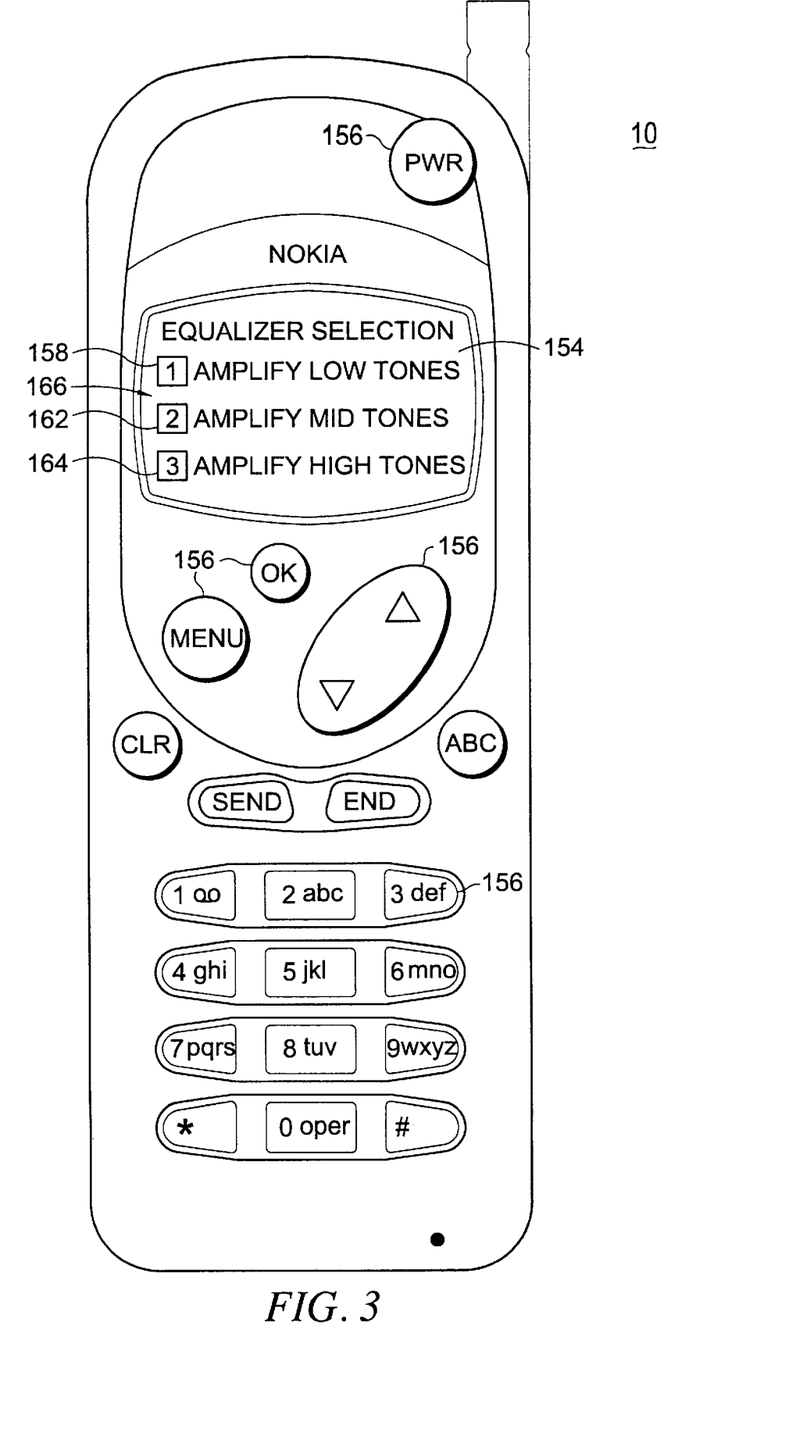
FIG. 3 illustrates a plan view of the radio telephone shown in FIG. 1 in which a menu-driven, user display is displayed upon a user display of the radio telephone during selection procedures by which an equalization curve by which to operate the frequency equalizer of an embodiment of the present invention is effectuated.

FIG. 3 illustrates the radio telephone 10 during operation of an embodiment of the present invention. Here, a LCD display element 154 and actuation keys 156 which together form the user interface 84 (shown in FIG. 1) are shown. An equalizer selection menu is further shown to be displayed upon the display element 154. As noted above, the controller 82 (shown in FIG. 1) causes the generation of the menu. In an exemplary implementation, the equalizer selection menu is caused to be displayed subsequent to actuation of the PWR key 156 and actuation of the MENU key 156 a selected number of times to sequence through menu options until the equalizer selection menu appears at the display element 154.

The equalizer selection menu here shows three selection possibilities, a first selection 158, a second selection 162, and a third selection 164. The three selection possibilities 158, 162, and 164 correspond with equalization curves of three groups of preset values of amplification levels stored in the memory device 78 (shown in FIG. 1). In other embodiments, other numbers of equalization curves are selectable by a user.

The first selection 158 is here representative of an equalizer curve which corresponds to a high-bass sounding audio signal to be generated by the radio telephone. The second selection 162 is representative of a mid-treble and mid-bass sounding audio signal. And, the third selection 164 is here representative of a high-treble sounding audio signal.

A user of the radio telephone selects one of the available selections by positioning a cursor 166 at the appropriate selection. Positioning of the cursor 166 is here effectuated by way of actuation of the up/down actuation key 156. Once the cursor 166 is appropriate positioned, the OK key 156 is actuated.

When the selection is made, the controller 82 (shown in FIG. 1) accesses the appropriate memory locations, retrieves indications of the values stored therein, and applies such values to the frequency equalizer 68. The equalizer 68 selectively amplifies the bandwidth-frequency regions of the signal applied thereto, responsive to the values of the preset amplification levels provided thereto. Thereby, audio signals of desired tonal characteristics are generated by the radio telephone.

Figure 4:
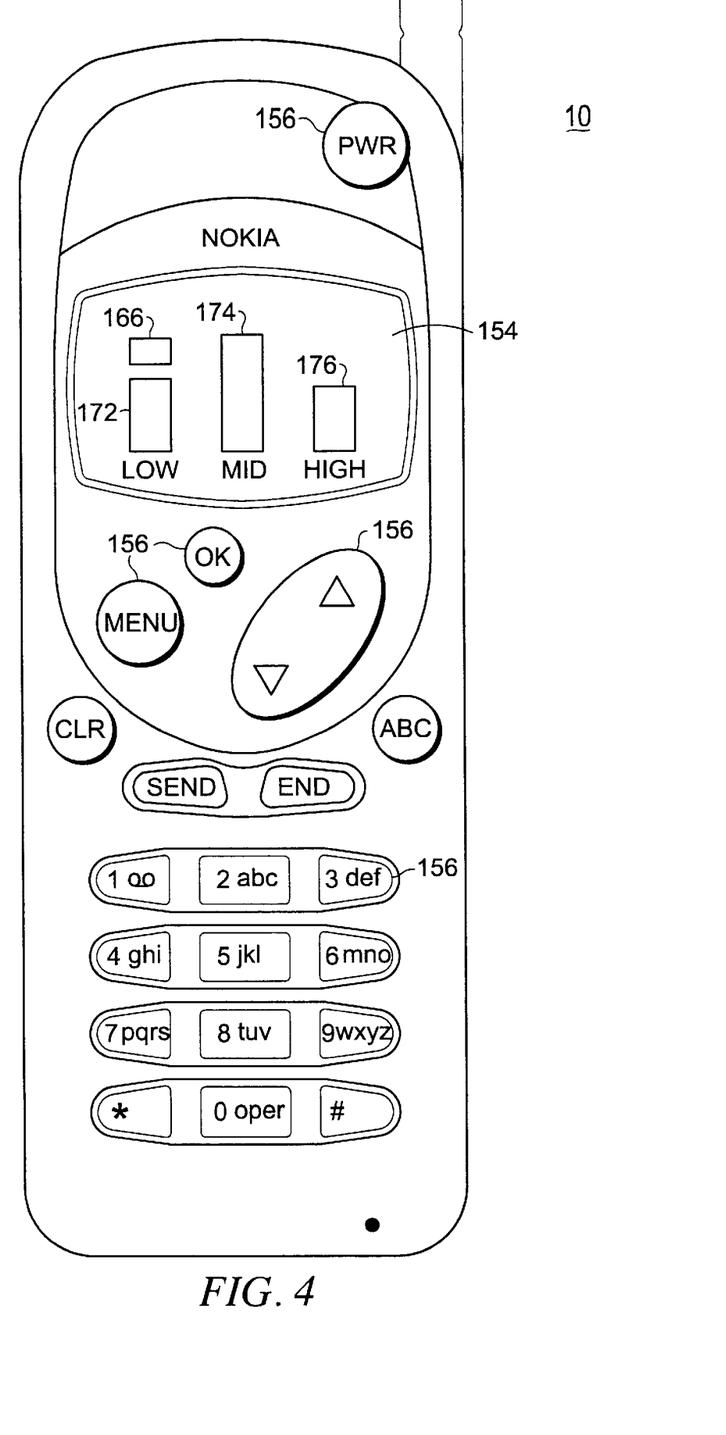
FIG. 4 illustrates a plan view, analogous to the plan view shown in FIG. 3, but illustrating a user display displayed upon the display element of the radio telephone during operation of another embodiment of the present invention.

FIG. 4 again illustrates the radio telephone 10 together with the display element 154 and actuation keys 156 which form the user interface 84 (shown in FIG. 1). In this embodiment, another equalizer selection menu is caused to be displayed by the controller 82 (also shown in FIG. 1) at the display element 154. Here, the values of the amplification levels by which the various bandwidth-frequency regions of signals applied to the frequency equalizer are selected by the user. Here, three columns 172, 174, and 176 indicate the amplification levels by which the selected bandwidth-frequency regions are to be amplified. The equalizer selection menu is here again also caused to be displayed subsequent to powering on of the radio telephone and sequencing through the menu by actuation of the MENU key 156 until the equalizer selection menu appears. Here, a cursor is positionable above a selected column 172, 174, or 176. Once positioned above the column, the up/down actuation key is actuated, thereby to increase or decrease the amplification level of the bandwidth-frequency region associated with the selected column. Once the desired equalization curve, represented by the values of the columns 172–176 is selected, the OK actuation key 156 is actuated, and the controller 82 provides the frequency equalizer with indications of the selected amplification levels. The frequency equalizer thereafter amplifies the selected bandwidth-frequency regions in accordance with the amplification levels selected by the user of the radio telephone.

Figure 5:
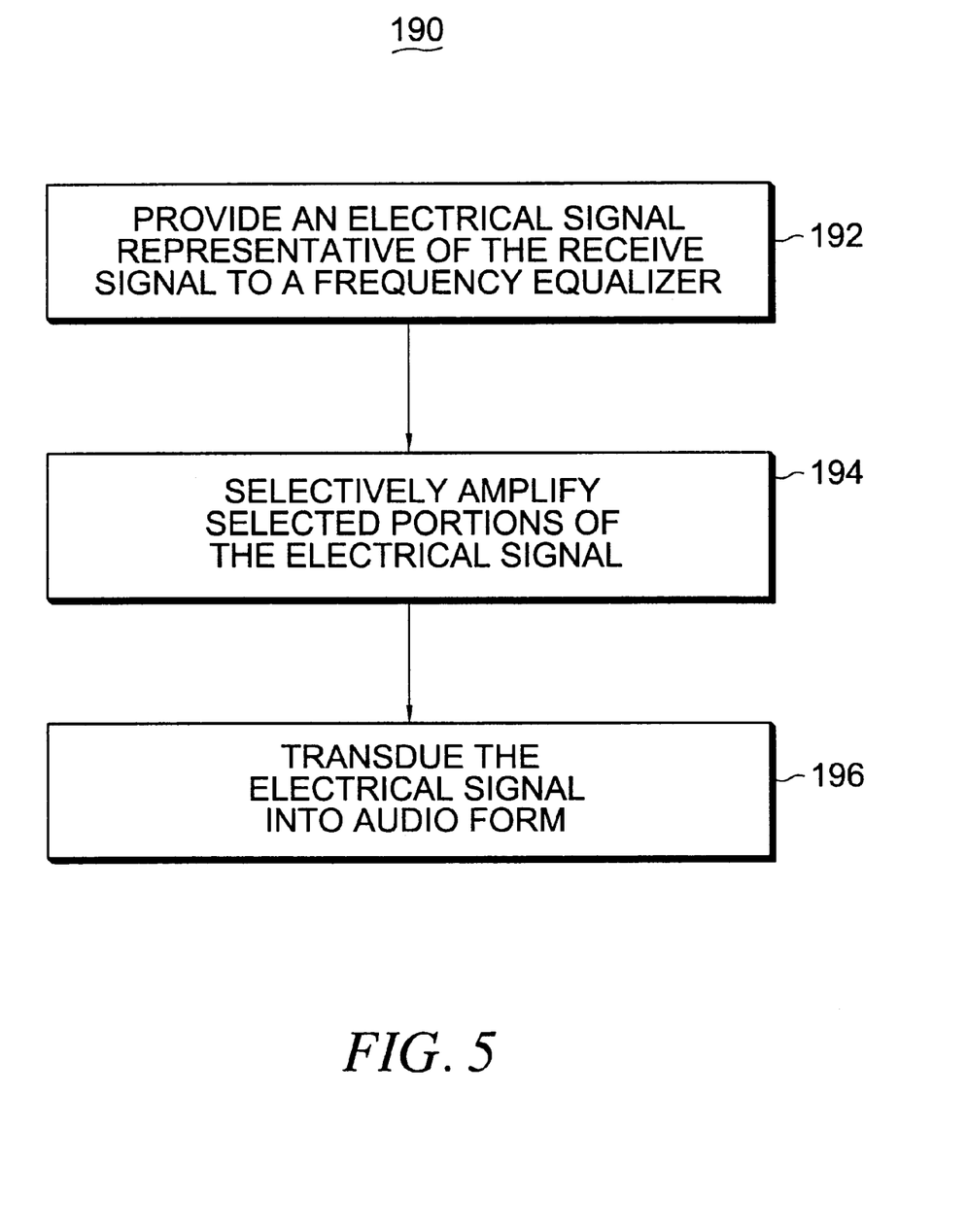
FIG. 5 illustrates a method flow diagram listing the method steps of the method of operation of an embodiment of the present invention.

FIG. 5 illustrates a method, shown generally at 190, of an embodiment of the present invention. The method 190 generates an audio signal of a selected tonal characteristic at a radio telephone receiver. First, and as indicated by the block 192, an electrical signal representative of the radio telephone receive signal is provided to a frequency equalizer. Then, and as indicated by the block 194, selected bandwidth frequency regions of the electrical signal are selectively amplified. And, as indicated by the block 196, the electrical signal, once amplified by the frequency equalizer is transduced into audio form.

Thereby, through operation of an embodiment of the present invention, audio signals generated by a radio telephone are caused to be of desired tonal characteristics. A user of the radio telephone is able to select the amplification levels at which different bandwidth-frequency regions of a signal representative of a receive signal received at the radio telephone are to be amplified. Thereby, the tonal characteristics of the resultant audio signal are selectable by the user to form the audio signal which sounds the best to the user.

The previous descriptions are of preferred examples for implementing the invention and the scope of the invention should not necessarily be limited by this description. The scope of the present invention is defined by the following claims.

I claim:

1. In a radio telephone hand-carriable by a user, the radio telephone having a radio receiver and a radio transmitter, the radio receiver for receiving a downlink signal transmitted thereto and having a decoder for decoding a representation of the downlink signal and for forming a decoded signal therefrom, a combination with the radio receiver of:

an audio frequency equalizer coupled to the radio receiver of the radio telephone to form a portion thereof and housed together therewith, and to receive an electrical signal representative of the decoded signal formed by the decoder of the radio receiver, the electrical signal defined by a signal bandwidth, the signal bandwidth divisible into bandwidth-frequency regions, said audio frequency equalizer for selectively amplifying the electrical signal at selectable amplification levels, each bandwidth frequency region into which the signal is divided amplified at a separately-selectable amplification level; and a user interface coupled to said frequency equalizer and hand carriable together with the radio receiver of the radio telephone, said user interface selectably actuable by the user to cause said frequency equalizer to amplify each bandwidth frequency region at the separately-selectable amplification level, said user interface forming a portion of the radio telephone and housed together therewith and hand-carriable by the user together with the radio telephone.

2. The combination with the radio receiver of claim 1 wherein said user interface forms a selector for selecting the amplification levels at which each bandwidth frequency region of the electrical signal is amplified.

3. The combination with the radio receiver of claim 2 further comprising a memory device, said memory device for storing preset values representative of the amplification levels at which each bandwidth frequency region is amplified by said audio frequency equalizer.

4. The combination with the radio receiver of claim 3 wherein the preset values stored at said memory device comprise a first set of preset values and at least a second set of preset values, said audio frequency equalizer amplifying the electrical signal of amplification levels corresponding to a selected one of the first set and at least second set, respectively, of the preset values.

5. The combination with the radio receiver of claim 4 wherein selection of which of the first set and the at least second set of preset values pursuant to which said audio frequency equalizer amplifies the electrical signal made by user actuation of said user interface.

6. The combination with the radio receiver of claim 5 wherein said user interface includes an actuation keypad and a display element, selective user actuation of said actuation keypad determinative of selection of which of the first set and the at least second set of preset values pursuant to which said audio frequency equalizer amplifies the electrical signal.

7. The combination with the radio receiver of claim 6 further comprising a controller coupled to said audio frequency equalizer, to said memory device, and to said user interface, said controller for causing the electrical signal to be amplified at amplification levels corresponding to the preset values of the selected one of the first and at least second sets selected by way of the user interface.

8. The combination with the radio receiver of claim 7 wherein said controller is further operable to display indicia of each of the first set of preset values and the at least second set of preset values on the display element of said user interface, and wherein user selection of the selected one of the first set of preset values and the at least second set of preset values is made by the user via actuation of the actuation keypad responsive to display on the display element the indicia of each of the first and at least second set, respectively, of the preset values.

9. The combination with the radio receiver of claim 8 wherein the preset values are user-inputtable by way of the actuation keypad of said user interface.

10. The combination with the radio receiver of claim 3 wherein the electrical signal which said audio frequency equalizer is coupled to receive is divided into a first bandwidth frequency region, a second bandwidth frequency region, and a third bandwidth frequency region, and wherein the preset values stored at said memory device comprise a first set having a first preset value, a second preset value, and a third preset value, the first preset value representative of the amplification level at which the first bandwidth frequency region is to be amplified, the second preset value representative of the amplification level at which the second bandwidth frequency region is to be amplified, and the third preset value representative of the amplification level at which the third frequency region is to be amplified.

11. The combination with the radio receiver of claim 10 wherein the preset values stored at said memory device further comprise at least a second set, the second set also having a first preset value, a second preset value, and a third preset value, said audio frequency equalizer amplifying the first bandwidth frequency region, the second bandwidth frequency region, and the third bandwidth frequency region at amplification levels corresponding to the first preset value, the second preset value, and the third preset value, respectively, of a selected one of the first set and the at least second set.

12. A method for generating an audio signal of a selected tonal characteristic at a radio telephone receiver hand-carriable by a user, the audio signal representative of a radio telephone receive signal received at a radio telephone, once decoded at a decoder of the radio telephone, said method comprising:

providing an electrical signal representative of the radio telephone receive signal, once decoded, to an audio frequency equalizer, the audio frequency equalizer integrally formed with the radio telephone receiver to be housed together therewith and to be carried there together by the user;

selectively amplifying, at the audio frequency equalizer, selected bandwidth frequency regions of the electrical signal by actuating a user actuator coupled to the radio telephone receiver, the user actuator forming a portion of the radio telephone to be housed together therewith and to be carried together therewith; and transducing the electrical signal, once selectively amplified by the audio frequency equalizer during said operation of selectively amplifying.

13. The method of claim 12 comprising the additional operation of selecting the amplification levels at which the selected bandwidth-frequency regions of the electrical signal are amplified.

14. The method of claim 13 wherein said operation of selecting comprises selecting between a first set of preset values and at least a second get of preset values, the preset values of the first and at least second sets, respectively, representative of selected amplification levels at which the bandwidth-frequency regions are to be amplified.

15. The method of claim 14 wherein the preset value selected during said operation of selecting are stored at a memory device.

16. The method of claim 13 wherein the electrical signal provided to the audio frequency equalizer during said operation of providing is divided into a first bandwidth frequency region, a second bandwidth frequency region, and a third bandwidth frequency region, and wherein the first set of preset values and the at least second set of preset values each contain a first preset value, a second preset value, and a third preset value, the first preset value of a selected set representative of the amplification level at which to amplify the first bandwidth frequency region, the second preset value of the selected set representative of the amplification level at which to amplify the second bandwidth frequency region, and the third preset value of the selected set representative of the amplification level at which to amplify the third bandwidth frequency region.

17. Apparatus for generating an audio signal of selected tonal characteristics at a radio telephone receiver portion of a radio telephone, the radio telephone hand-carriable by a user, and the audio signal representative of a radio telephone receiver signal received at the radio telephone, once decoded by a decoder of the radio telephone receiver portion, said apparatus comprising:

an audio frequency equalizer coupled to the radio receiver of the radio telephone to form a portion thereof and housed together therewith, thereby to receive an electrical signal representative of the radio telephone receive signal, once decoded by the decoder, the electrical signal defined by a signal bandwidth, the signal bandwidth divisible into bandwidth-frequency regions, said frequency equalizer for selectively amplifying the electrical signal at selectable amplification levels; and a selector coupled to said audio frequency equalizer, said selector for selecting the amplification levels at which each bandwidth frequency region of the electrical signal is amplified, said selector integrally formed with the radio telephone receiver to be hand-carriable together therewith.

18. The apparatus of claim 17 wherein said selector further comprises a user interface, the amplification levels at which each bandwidth frequency region of the electrical signal is amplified.

19. The apparatus of claim 17 wherein said selector further comprises a memory device, said memory device for storing preset values representative of the amplification levels at which each bandwidth frequency region is amplified by said audio frequency equalizer.

* * * * *